United States Patent [19]
Blanton

[11] Patent Number: 5,374,903
[45] Date of Patent: Dec. 20, 1994

[54] GENERATION OF WIDEBAND LINEAR FREQUENCY MODULATION SIGNALS

[75] Inventor: James L. Blanton, Culver City, Calif.

[73] Assignee: Hughes Aircraft Company, Los Angeles, Calif.

[21] Appl. No.: 185,015

[22] Filed: Apr. 22, 1988

[51] Int. Cl.$^5$ .......................... H03B 23/00; H03L 7/06
[52] U.S. Cl. .......................................... 331/4; 331/47; 331/178
[58] Field of Search .................. 331/1 A, 4, 18, 30, 331/47, 106, 178

[56] References Cited

U.S. PATENT DOCUMENTS 4,160,958 7/1979 Mims et al. ...................... 331/4 X
4,546,328 10/1985 Smith et al. .................... 331/178 X Primary Examiner—David C. Cain
Attorney, Agent, or Firm—Leonard A. Alkov; Wanda K. Denson-Low

[57] ABSTRACT

A low-frequency low bandwidth Linear Frequency Modulation (LFM) waveform, nominally a 1 MHz to 10 Mz swept frequency analog sinusoid or digital square wave, is produced by direct digital synthesis. This waveform is upconverted in frequency and expanded in bandwidth, nominally to microwave frequencies with bandwidths of nominally 160-360 MHz, in a multiplying offset phase locked loop. The phase locked loop also linearly frequency modulates a X-band carrier with the microwave frequency LFM waveform to produce an output signal suitable for Synthetic Aperture Radar. The phase locked loop induces low phase error, and may be closed around the radar transmitter to remove phase errors induced by that unit.

18 Claims, 2 Drawing Sheets

GENERATION OF WIDEBAND LINEAR FREQUENCY MODULATION SIGNALS

BACKGROUND OF THE INVENTION

1. Field of the Invention

The present invention concerns the direct digital generation of Linear Frequency Modulation (LFM) signals such as are applicable to radars.

2. Background of the Invention

Frequency-Modulated (FM) radar is a form of radar in which the radiated wave is modulated in frequency and the returning echo beats with the wave being radiated, thus enabling the range to be measured. The use of wideband Linear Frequency Modulation (LFM) coded waveforms in radar for purposes of pulse compression is a well known technique. In peak-power-limited radar transmitters, the use of LFM permits an increased amount of energy to be transmitted in a radar pulse by increasing the pulse duration while maintaining the range resolution, or signal bandwidth, of a shorter pulse.

Wideband LFM waveforms are applicable to high resolution Synthetic Aperture Radars, and to target identification and target counting modes in multi-mode airborne radars. These radars generally require broadband microwave signals in order to measure range profiles of targets of interest and opportunity. For example, and regardless of the waveform modulation format, a range resolution R requires a transmitted bandwidth B of at least $B=aC/2R$, where "C" is the propagation velocity of light and "a" is a constant (usually 1.0 to 1.2) related to signal processing weighting. Moreover, radar systems using large signal bandwidths may often use "stretch" waveforms as described by W. Caputi in "Stretch: A Time Transformation Technique", appearing in IEEE Transactions on Aerospace and Electronic Systems, Volume AES-7, March 1971. Stretch waveforms can reduce intermediate frequency (IF) and signal processing bandwidths by transmitting waveforms of duration longer than the range swath collection time. Stretch radar systems typically require waveforms of 300 MHz bandwidth and 500 microsecond time duration on a carrier frequency which is typically X band in the order of 10 GHz. For such a radar system the bandwidth-time product BT is thus 150,000, and the waveform slope K is $6 \times 10$ Hz/second. LFM waveforms satisfy these requirements.

Another requirement sometimes placed on LFM waveforms in certain radar applications is that the transmitted pulse, or LFM waveform, should be variable in bandwidth and duration to match the functional requirements of a selected operating mode. A signal processing matched filter required to obtain this variability is frequently realized by a digital signal processor. A digital signal processor is capable of processing signals with a wide range of bandwidth-time, BT, products. Moreover, the exciter of certain radar systems must also be flexible, which again leads to the flexibility of digital waveform generation techniques.

Still another requirement of LFM waveforms — in addition to the required large BT product and the required flexibility in generating both B and T — is that residual generation errors should be very low. This is so that the side lobes of large target returns do not mask weaker target returns. An amplitude weighting of the received radar return signals, reducing side lobes to less than −35 dB, is frequently used in radar systems. Hence, the errors in the LFM waveform generation must be less than −35 dB.

A first prior art approach to generation of a LFM waveform sweeps the frequency of an X band carrier wave radar signal in a Voltage Controlled Oscillator (VCO). That approach is called the linearized swept-VCO approach. The approach requires complex error correction loops in order to produce high accuracy, low distortion, LFM waveforms. The error correction loops rely on a delayed sample of the VCO output signal to determine frequency linearity. Absolute or fixed external references are not used. Hence, a potential for residual errors exists in this approach.

A second prior art approach to the generation of LFM waveforms is described in U.S. Pat. No. 4,160,958. This approach uses a stable frequency source of a carrier signal which is adjusted in phase by a binary phaser. A tuned Voltage Controlled Oscillator (VCO) is locked to the adjusted phase source via a sampled phase-locked loop. This sampling is at microwave frequencies. The instantaneous phase of the desired LFM waveform is computed by a Differential Data Analyzer (DDA), a common digital computer element. The DDA drives the phaser through the desired progression. A balanced mixer compares the phase of the VCO to that phase which is digitally generated. The difference is sampled, forming an error signal for the wideband phase-locked loop. The VCO acts as a smoothing filter and produces a desired waveform. The computation in the DDA is performed, and the phaser control is updated, at a rate that is typically 30 MHz. Since it is desired to generate LFM waveforms which are typically of 900 MHz bandwidth, the sample aperture must be less than 200 picoseconds. A sampling microwave phase detector of such small sampling aperture is considered a high-cost, high-risk component. Moreover, the phaser or digitally controlled phase shifter has a limited resolution and accuracy at microwave frequencies, and thus sets a bound on the ultimate performance obtainable with this approach. Since the phase shifting is normally quadratic, this second approach is called direct quadratic phase shifting at microwave frequency, and is described in the paper "Digital Generation of Wideband Linear FM Waveforms" appearing in the IEEE MTT-S International Microwave Symposium Digest (1980).

Before describing a third approach it may be useful to review the use of the term "LFM waveform", especially as used in the approach described below and in the present invention. "Wideband" LFM waveform refers to a microwave frequency (1000's of MHz) waveform in the form of a linearly frequency modulated carrier signal with a bandwidth of 10's or 100's or MHz. "Baseband" LFM waveform refers to a much lower frequency (10's of MHz), much lower bandwidth (MHz), waveform. Baseband LFM waveforms are employed after frequency multiplication and bandwidth expansion in order to perform linear frequency modulation of the microwave frequency carrier signal, producing the "wideband" LFM waveform. Thus, in LFM both the modulated and the modulating signals have confusingly similar names, based in the "LFM" abbreviation which is applied to both.

A third approach to the generation of wideband LFM waveforms involves direct digital synthesis at baseband, followed by modulation onto a carrier, and then followed by frequency multiplication. This approach is described in the paper "Digital Generation of Wideband LFM Waveforms" set forth in the Proceedings of the IEEE International Radar Conference page 170, et seq., (1975). As with the present invention the utility of digital generation of a LFM waveform is recognized in this approach. The generation of a LFM waveform is, both within the prior art approach and within the present invention, necessarily at a baseband, i.e. at a frequency much less than the microwave frequency at which the radar signal is transmitted. A digitally generated LFM waveform cannot be directly generated at microwave frequencies because of performance limitations in digital components. This third prior approach generates the LFM waveform at baseband, and centered on DC. The LFM waveform is then modulated onto a carrier. Only after such modulation is the composite modulated waveform converted to a microwave frequency by means of direct frequency multiplication. This approach requires in-phase and quadrature (I and Q) channels in the baseband portion of the waveform generator. Imbalances between the I and Q channels are a source of errors, and the two channels double the amount of hardware required in the portion of the waveform generator wherein such signals are developed. The modulation required is single sideband, which produces undesired image frequencies and carrier signal leakage which must both be filtered out.

Each of the above described prior art approaches has error sources that will result in the ultimately transmitted LFM microwave frequency waveform exhibiting some phase and/or frequency errors in its modulation. Low order (quadratic) frequency errors degrade range resolution by broadening the main lobe of the range-compressed radar return over a number of range cells. Higher order (multi-ripple) non-linearities in the LFM waveform result in undesirable range sidelobes on strong radar returns.

Generally these error sources cause error to accrue in all regions of the LFM signal generation, particularly in the microwave region. Because the first, linearized swept-VCO, approach, and the second, direct quadratic phase shifting at microwave frequency, approach both "compute" the linear frequency modulation in the same frequency spectrum wherein the microwave carrier signal is modulated, it is obvious that errors in "computation" of the appropriate modulation accrue to the transmitted signal. The third prior art approach introduces error in the generation (preferably transpiring by direct digital synthesis) of the LFM signal at baseband. Such errors inherent in the third prior art approach continue to accrue in the direct frequency multiplication, and in the imbalances between the I and Q channels at baseband. Those error sources will not be present within the approach to generation of a wideband LFM waveform in accordance with the present invention.

Futhermore, and importantly, there exists a problem related to the several error sources present within each of the prior art approaches to the generation of LFM signals. This problem is that the radar transmitter will itself induce phase errors. The prior art approaches, and most particularly the third approach, do not permit the recognition or the removal of phase errors introduced in the final transmitter stage. The approach in accordance with the present invention will permit removal of these transmitter-induced phase errors.

SUMMARY OF THE INVENTION

The present invention is embodied in a method and apparatus for generating wideband Linear Frequency Modulation (LFM) signals. The LFM signals generated will exhibit a very large Bandwidth-Time (BT) product at a number of selectable B/T slopes. A wideband LFM signal is typically applicable to high resolution Synthetic Aperture Radars, and to multimode radars nominally operating at X-band or K-band frequencies (nominally of the order of 8–18 GHz ).

The preferred embodiment of an apparatus for generating a wideband LFM signal in accordance with the present invention includes a generator of a low frequency, low bandwidth baseband LFM signal (i.e., not the final broadband LFM signal). This generator is preferably a direct digital synthesizer. The apparatus further includes a multiplying offset phase-locked loop. Components within this loop receive the low frequency, low bandwidth, baseband LFM signal and also receive a fixed frequency reference signal in the band (nominally K-band or X-band) of the carrier signal. This multiplying offset phase-locked loop simultaneously (i) upconverts in frequency and (ii) expands in bandwidth the received low frequency, low bandwidth, baseband LFM signal to (iii) produce a wideband high frequency LFM signal, by modulation of a microwave carrier signal.

There are two major embodiments of this multiplying offset phase-locked loop which embodiments respectively employ a digital and an analog phase detector. There are two corresponding embodiments of the direct digital synthesizer of the baseband LFM signal, which respectively supply the phase detector with either an analog or a digital signal waveform. Each embodiment of the multiplying offset phase-locked loop has a Voltage Controlled Oscillator, VCO, which is controllable by a control voltage to frequency modulate a microwave carrier signal. A portion of this frequency modulated microwave carrier signal generated in the VCO is mixed in a mixer with a fixed frequency reference signal (in the same band as the carrier signal) in order to produce a difference signal. A frequency divider circuit reduces the frequency of this difference signal to the lower frequency range of the baseband LFM signal. This reduced frequency difference signal is supplied as one input to a phase detector which receives as its other input the baseband LFM signal directly from the digital synthesizer of this signal.

If the phase detector is an analog embodiment, then the divided frequency signal is low pass filtered to produce a corresponding sine wave signal. It is this filtered signal that is then supplied as an input to the phase detector. If the phase detector is digital, then it directly receives the reduced frequency signal produced by the frequency divider circuit. Whether the phase detector is analog or digital, it produces a control voltage responsive to the detected phase difference between the reduced frequency difference signal received (ultimately) from the frequency divider, and the low frequency, low bandwidth, baseband LFM signal which is received from the direct digital synthesizer. This control voltage is used to control the VCO to frequency modulate the carrier signal.

The upconversion in frequency and expansion in bandwidth of the low frequency, low bandwidth, baseband LFM signal and the modulation of a carrier, both within a single multiplying offset phase lock loop, is both efficient and effective. During the portion of each time interval that the radar transmitter is transmitting an amplified wideband high frequency LFM signal, a sample of the transmitted signal may be routed to the mixer in lieu of the unamplified sample of the same signal which is produced by the VCO. As a result of that construction a phase-locked loop is closed around the radar system transmitter, removing phase errors induced in the radar signal by the transmitter.

Accordingly, it is a first object of the present invention to generate a low frequency, low bandwidth baseband LFM signal by direct digital synthesis. The direct digital synthesis performed preferably generates a linearly frequency modulated (quadratically phase modulated) waveform, or chirp signal.

It is a further object of the present invention to efficiently and effectively generate a wideband, high frequency, LFM signal corresponding to the digitally synthesized low frequency, low bandwidth, baseband LFM signal. In accordance with this present invention the generation of the broadband LFM encoded microwave output signal is accomplished in a phase-locked loop which upconverts in frequency and expands in bandwidth the low frequency low bandwidth baseband LFM signal received from the direct digital synthesizer, and simultaneously modulates a microwave carrier signal.

It is a further object of the present invention that the wideband high frequency LFM signal should exhibit a low phase error.

It is a further object of the present invention that any phase error induced by the transmitter during the amplification and transmission of a wideband high requency LFM signal should be compensated, or corrected, during the transmission of such signal.

BRIEF DESCRIPTION OF THE DRAWINGS

These and other aspects, attributes, and objectives of the present invention will become increasingly clear upon reference to the following drawings and accompanying specification wherein.

DESCRIPTION OF THE PRESENTLY PREFERRED EMBODIMENT

The present invention is directed to the generation of wideband linear frequency modulation, LFM, signals such as are typically (but without limitation) applicable to synthetic aperture radar. In one of its aspects the invention is characterized by the simplicity with which this signal is generated. Particularly, a low frequency, low bandwidth, baseband LFM signal is generated by direct digital synthesis. That baseband signal, and a constant frequency reference signal in the microwave band, are used within a multiplying offset phase-locked loop to generate a broadband LFM signal. Particularly, the baseband LFM signal is simultaneously upconverted in frequency and multiplied in bandwidth such that the phase-locked loop modulates a microwave frequency carrier signal to produce the broadband LFM output signal.

The invention is further characterized in that the simultaneous upconversion, bandwidth multiplication, and carrier modulation is accomplished with low phase error. The invention is still further characterized in that the phase-locked loop may be closed around the transmitter of the amplified wideband LFM signal, thereby enabling transmitter-induced phase error to be removed from the system. These and other aspects of the invention should be maintained in mind in order that the scope of the invention may be more clearly appreciated during discussion of the following preferred embodiments of exemplary electronic circuit apparatus for implementing the invention.

Figure 1:
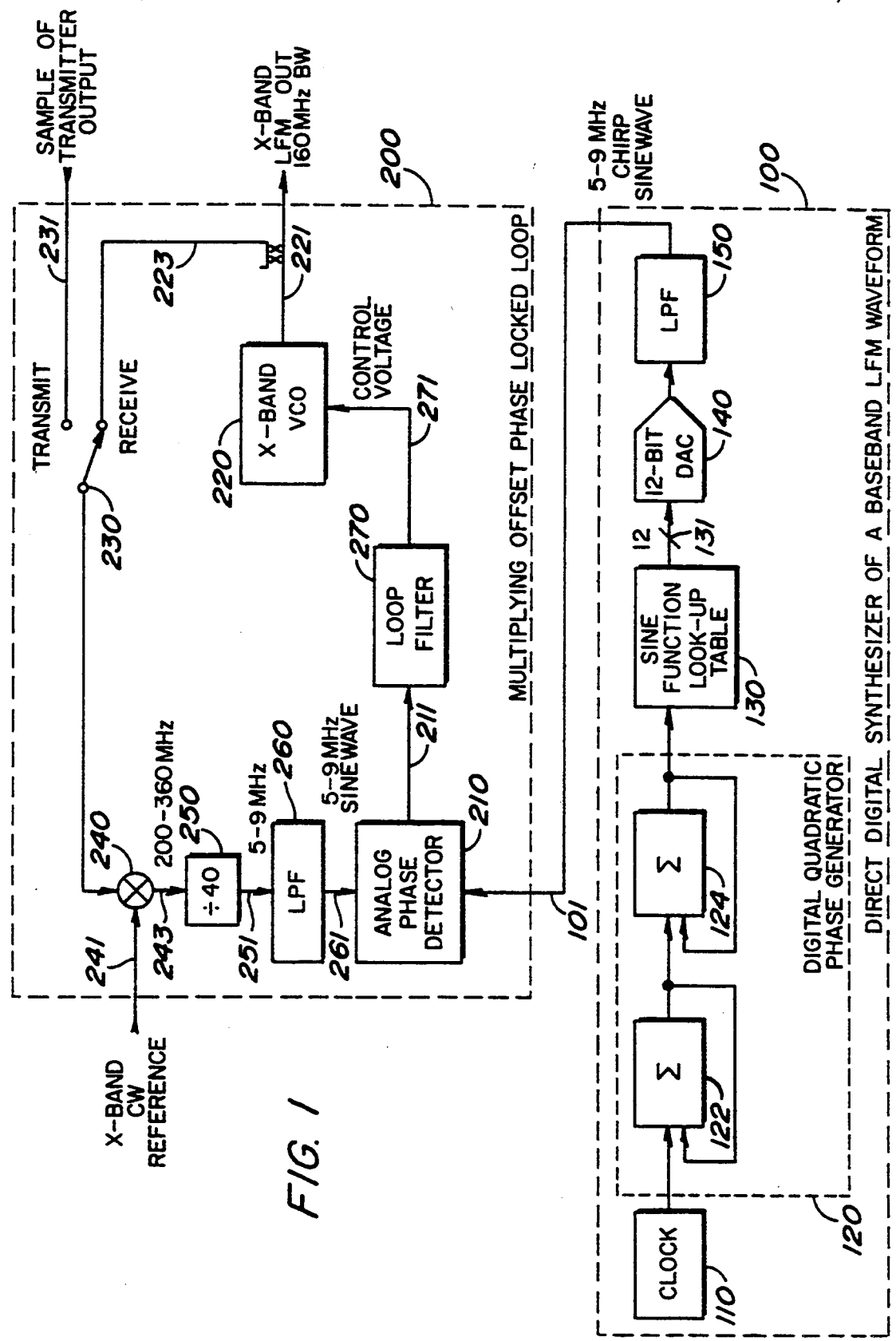
FIG. 1 is a block diagram of a first variant of a preferred embodiment of an apparatus for generating wideband LFM signals in accordance with the present invention.
Figure 2:
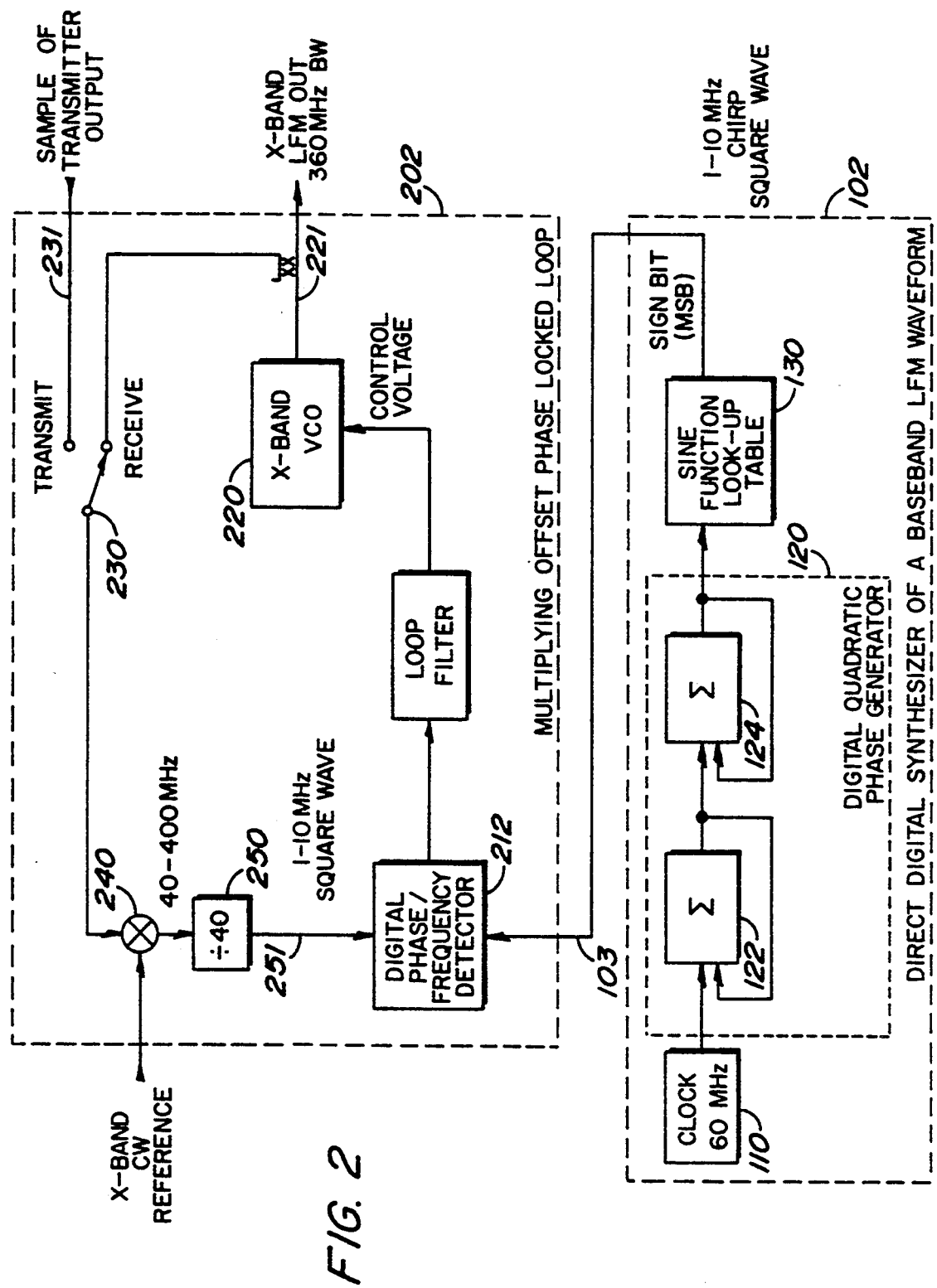
FIG. 2 is a block diagram of a second variant of a preferred embodiment of an apparatus for generating wideband LFM signals in accordance with the present invention.

A first variant embodiment of an apparatus in accordance with the present invention is shown in FIG. 1, and a second variant embodiment is shown FIG. 2. Each embodiment employs a DIRECT DIGITAL SYNTHESIZER OF A BASEBAND LFM WAVEFORM, and also a MULTIPLYING OFFSET PHASE-LOCK LOOP. However, the first embodiment shown in FIG. 1 uses an ANALOG PHASE DETECTOR 210, such as a Watkins-Johnson Model M6A, which has analog signal inputs including the baseband LFM waveform generated by the DIRECT DIGITAL SYNTHESIZER OF A BASEBAND LFM WAVEFORM 100. The second preferred embodiment shown in FIG. 2 has, instead, a DIGITAL PHASE/FREQUENCY DETECTOR 212 which receives digital signals, including the baseband LFM waveform generated by the DIRECT DIGITAL SYNTHESIZER OF A BASEBAND LFM WAVEFORM 102. A Motorola Model MC12540 may be used to implement the functions of a DIGITAL PHASE/FREQUENCY DETECTOR 212. The difference between the first and second preferred embodiments not only involves the analog versus the digital detection of phase, and the development of signals supporting this detection, but also relates to the bandwidth realizable with the apparatus and method in accordance with the present invention. Generally, however, the two embodiments function equivalently. Specific frequencies, bit widths, etc. within the following discussion should be considered to be illustrative only and not, unless specifically stated, indicative of any differences between the embodiments or limitations upon the invention.

Considering the first embodiment electronic circuit apparatus in accordance with the present invention as shown in FIG. 1, a baseband LFM waveform in the form of a 5–9 MHz CHIRP SINE WAVE 101 is generated in DIRECT DIGITAL SYNTHESIZER OF A BASEBAND LFM WAVEFORM 100. A LFM signal, either baseband or broadband, is a signal the frequency of which is linearly increasing (or decreasing) in time. The phase of such a signal is quadratic in time. In order to derive such a signal, a stable oscillator CLOCK 110, a clock crystal oscillator that may be constructed from discrete components or fast logic gates, generates a clock signal at 60 MHz. This clock signal is applied to a DIGITAL QUADRATIC PHASE GENERATOR 120, essentially consisting of double accumulators 122, 124. A Texas Instruments SN744281 accumulators may be used to implement the functions of ACCUMULATOR 122, 124. The numbers produced by the DIGITAL QUADRATIC PHASE GENERATOR 120 are applied to address a SINE FUNCTION LOOK-UP TABLE 130, a read-only memory (ROM) or random access memory (RAM), where the digital phase values are converted into points on a sinusoidal waveform (still in digitalized form). A Texas Instruments ROM Model TBP28S166 may be used to implement the functions of SINE FUNCTION LOOK-UP TABLE 130. It is suggested in FIG. 1 that the digitalized sinusoidal waveform output signal 131 should be of 12 bits, although this is essentially arbitrary. The 12 bit signal output 131 from the SINE FUNCTION LOOK-UP TABLE 130 is digitally-to-analog converted in 12-BIT DAC 140, such as the Plessey Model SP9770, into a stepped approximation of a linear frequency modulated LFM sinusoidal waveform. Following the 12-BIT DAC 140, a low pass filter LPF 150, operating at a cutoff frequency of nominally 10 MHz, produces a smooth swept frequency LFM sinusoidal waveform. A Chebyshev low-pass filter, 0.1 dB ripple, 10 MHz cutoff can readily be contructed to implement the LPF 150 mentioned above. This signal, labeled 5-9 MHz CHIRP SINE WAVE 101 is used as a reference signal in the MULTIPLYING OFFSET PHASE-LOCK LOOP 200.

The digital generation of a LFM waveform at baseband just described may be effected in a conventional manner. The mathematical basis of an LFM waveform (whether baseband or broadband), and a waveform that has a phase which is quadratic in time, is well understood by those skilled in the art. The digital generation of a quadratic progression in double accumulators, and the use of this digital generation to convert by table look-up of a sine (or cosine) to a LFM analog signal, is also conventional. See, e.g. "Digital Generation of Wideband LFM Waveforms", Symposium Proceedings of IEEE International Radar Conference, p. 170 et. seq. (1975).

Continuing in FIG. 1, a functional element wherein the present invention differs considerably from prior art approaches to the generation of broadband LFM signals is the MULTIPLYING OFFSET PHASE-LOCKED LOOP 200. As previously stated, this phase-locked loop performs the processes of upconversion and bandwidth expansion on the LFM waveform, and the modulation of a microwave frequency carrier signal, concurrently in a single step. This construction is both efficient in the components required and effective to generate a broadband LFM signal having low phase error.

Within the MULTIPLYING OFFSET PHASE-LOCK LOOP 200, a microwave, X-BAND VCO 220, such as an Avantek Model VTO-8850 produces the broadband LFM output signal labeled X-BAND LFM OUT 160 MHz BW 221 in response to a CONTROL VOLTAGE 271. This signal and others are identified with specificity for reasons of illustration to persons who would attempt to quickly understand the invention by reference to the figures. It will, of course, be understood that the present invention is not limited to X-band, nor to a bandwidth of 160 MHz; these parameters being nominal and illustrative only. The signal X-BAND LFM OUT 160 MHz BW 221 is gated (not shown) and provided to a transmitter (not shown) as the drive signal for a radar system. This signal is offset (not shown) by a first intermediate frequency, IF, signal to produce the receiver local oscillator (LO) signal (not shown). Neither the transmitter, nor the LO offsetting, nor the receiver are part of the present invention and are correspondingly not shown in FIG. 1.

A sample of the VCO output signal 221 is routed as signal 223 through switch 230, such as a MACOM MA-8430-230, to be mixed with a fixed frequency reference signal, nominally X-BAND CW REFERENCE signal 241, in mixer 240. A Watkins-Johnson Model M31A may be used to implement the functions of mixer 240. The required characteristics of X-BAND CW REFERENCE SIGNAL 241 are that it should be a stable fixed frequency, and in the band of the carrier signal which is produced by X-BAND VCO 220. The mixer 240 produces a difference signal, nominally labeled as signal 200-360 MHz 243. It may be noted that this difference signal is of considerably greater frequency than the 5-9 MHz CHIRP SINE WAVE 101. It is the varying frequency of this difference signal that reflects the difference between the X-BAND CW REFERENCE 241 and the X-BAND LFM OUT 160 MHz BW 221. Because of this relatively high frequency, the difference signal 243 is applied to a frequency divider circuit, labeled — 40 250, for dividing by (nominally) 40 in order to reduce it to the same frequency range as the digitally synthesized LFM baseband signal. A Plessey SP8716 may be used to implement the functions of frequency divider 250. The reduced frequency signal is so labeled as, typically, 5-9 MHz 251. The divider 250 reduces loop gain, so the smallest permissable division ratio should preferably be used. The reduced frequency difference signal 251 contains harmonics, and is accordingly low pass filtered by LPF 260, which has a nominal cutoff frequency of 10 MHz, in order to essentially eliminate all harmonics above and including the third. A Chebyshev lowpass filter, 0.1 dB ripple, 10 MHz cutoff can be used for the LPF 260 mentioned above. Since square waves contain only odd harmonics, this filter produces the sine wave labeled as 5-9 MHz SINE WAVE 261.

The ANALOG PHASE DETECTOR 210 receives the reduced frequency difference signal 5-9 MHz SINE WAVE 261 and the baseband LFM signal 5-9 MHz CHIRP SINE WAVE 101. It produces an output error voltage signal 211 that is proportional to the time misregistration between these two signal wavefoms 261, 101. This signal 211 is low pass filtered in LOOP FILTER 270, easily constructed by a person skilled in the art of phase locked loops, to produce CONTROL VOLTAGE 271. As previously explained, this signal CONTROL VOLTAGE 271 is supplied to the VOLTAGE CONTROLLED OSCILLATOR X-BAND VCO 220 to produce the broadband LFM signal that, when gated, serves as the drive signal to the transmitter of the radar system. Because the MULTIPLYING OFFSET PHASE-LOCK LOOP 200 is closed, the phase accuracy in generation of signal X-BAND LFM OUT 160 MHz BW 221 is essentially the phase accuracy of the two signals which are received by the PHASE-LOCK LOOP 200 nominally X-BAND CW REFERENCE 241 and 5-9 MHz CHIRP SINE WAVE 101.

Furthermore, during the transmit interval of the transmitter of the radar system (not shown) a SAMPLE OF TRANSMITTER OUTPUT 231 may be selected by switch 230 in lieu of the signal 223 which is a portion of the X-BAND LFM OUT 160 MHz BW signal 221. The phase-locked loop may thus be closed around the transmitter (not shown) to remove phase errors introduced by that unit.

A second preferred embodiment of an apparatus for generating a wideband LFM signal is shown in FIG. 2. This embodiment differs from the first embodiment shown in FIG. 1 principally by employing a DIGITAL PHASE-FREQUENCY DETECTOR 212 within the MULTIPLYING OFFSET PHASE-LOCK LOOP 202 in lieu of the ANALOG PHASE DETECTOR 210 employed in the first embodiment. The DIGITAL PHASE-FREQUENCY DETECTOR 212 uses square wave inputs. Correspondingly, it receives a square wave signal directly from frequency divider 250 as signal 1-10 MHz SQUARE WAVE 251 without the necessity of filtering such signal to a sine wave, as is effected by low pass filter LPF 260 within the first embodiment (shown in FIG. 1). Further, the DIRECT DIGITAL SYNTHESIZER OF A BASEBAND LFM WAVEFORM 102 produces a digital, square wave, output signal 1-10 MHz CHIRP SQUARE WAVE 103. The 12-BIT DAC 140 and the LPF 150 within the first embodiment (shown in FIG. 1) are not required. Furthemore, a 12 bit output from the SINE FUNCTION LOOK-UP TABLE 130 is not required because the sign bit alone labeled SIGN BIT (MSB), is sufficient to generate a square wave.

Within the second embodiment of the present invention shown in FIG. 2, the frequency of operation is not restricted by the need to filter out harmonics in a low pass filter from the reduced frequency signal fed back within the phase-locked loop. It may be noted that all phase information is detected by the DIGITAL PHASE-FREQUENCY DETECTOR 212, and again converted into an output error voltage that is proportional to the time misregistration between the two received digital waveforms. The phase information is carried in the zero crossings of the synthesized waveform 1-10 MHz CHIRP SQUARE WAVE 103.

It will be understood that the number of samples per cycle which is obtainable within the DIRECT DIGITAL SYNTHESIZER OF A BASEBAND LFM WAVEFORM 102 is a function of the frequency response of the digital components. The simple digital components within the circuit may be modified for enhanced performance. Certain technology such as gallium arsenide presents the possibility of generating digital baseband LFM waveforms at frequencies greater than 10 MHz. Multiplexing, or parallelism, in the direct digital synthesis of a baseband LFM waveform may also enhance system performance.

In accordance with the preceding discussion the present invention should be perceived to be broadly directed to a method and apparatus for generating a broadband LFM signal. The invention particularly employs a multiplying offset phase-locked loop which simultaneously upconverts in frequency and expands in bandwidth a received baseband LFM signal (which is preferably digitally synthesized), and produces the broadband LFM signal at microwave frequencies. The phase-locked loop may additionally be closed around the transmitter in order to remove phase errors introduced in that unit. It is possible for a routineer in the art of radar system design to create phase-locked loops at microwave frequencies that employ diverse elements in various orders. Therefore the scope of the Multiplying Offset Phase-locked Loop in accordance with the present invention should be interpreted in accordance with the unique function performed by such loop, and not merely in accordance with any particular implementation that realizes this function. Likewise, the direct digital synthesis of a baseband LFM waveform could proceed in diverse manners. The well known flexibility of digital signal generation techniques are fully adaptable to the purposes of the present invention.

Accordingly, the present invention should be interpreted in accordance with the broader aspects of the invention and not solely in accordance with those particular two embodiments within which the invention has been illustrated.

What is claimed is:

1. An apparatus for generating a wideband Linearly Frequency Modulated, LFM, carrier signal comprising:
   a generator of a low frequency, low bandwidth, baseband LFM signal;
   a variably offset phase locked loop (i) receiving the baseband LFM signal and also a fixed frequency reference signal in the band of a carrier signal, (ii) upconverting in frequency and expanding in bandwidth the received baseband LFM signal, to (iii) produce a wideband high frequency LFM signal.

2. The apparatus according to claim 1 wherein the variably offset phase locked loop comprises:
   a Voltage Controlled Oscillator, VCO, controllable to modulate the carrier signal in accordance with a modulation control signal;
   a mixer for mixing a portion of the modulated carrier wave output signal received from the VCO with the fixed frequency reference signal to produce a difference signal;
   a frequency divider circuit for receiving the difference signal from the mixer and reducing it in frequency to the low frequency range of the baseband LFM signal; and
   a phase detector for producing the modulation control signal responsive to a detected phase difference between the reduced frequency difference signal received from the frequency divider circuit and the received low frequency, low bandwidth, LFM signal.

3. The apparatus according to claim 2 further comprising:
   a transmit/receive switch disposed within the phase locked loop, said switch having a first position for communicating to the mixer a portion of a signal output from the VCO and a second position for communicating to the mixer a portion of the modulated carrier wave output signal being transmitted.

4. The apparatus according to claim 2 wherein the variably offset phase locked loop further comprises:
   a low pass filter disposed between the frequency divider circuit and the phase detector for substantially filtering harmonics above and including the third harmonic from the reduced frequency difference signal produced by the frequency divider circuit.

5. The apparatus according to claim 2 wherein the variably offset phase locked loop further comprises:
   a loop filter disposed within the phase locked loop between the phase detector and the VCO.

6. The apparatus according to claim 2 wherein the phase detector is an analog circuit, and wherein the received LFM signal is sinusoidal.

7. The apparatus according to claim 2 wherein the frequency divider circuit and phase detector are digital circuits, and wherein the received LFM signal is a square wave.

8. The apparatus according to claim 1 wherein the generator comprises:
   a direct digital synthesizer.

9. The apparatus according to claim 8 wherein the direct digital synthesizer comprises:
   an oscillator for producing clock signals a digital quadratic phase generator for receiving the clock signals and producing a series of binary numbers representing a quadratic progression;

a memory for storing a sine look-up table and addressed by the series of binary numbers to produce digitalized data representations of the points upon a sinusoidal waveform.

10. The apparatus according to claim 9 wherein the direct digital synthesizer further comprises:

a digital-to-analog converter, DAC, for receiving the digitalized data representations and converting them to a swept frequency sinusoid approximation.

11. The apparatus according to claim 10 wherein the direct digital synthesizer further comprises:

a low pass filter for receiving the swept frequency sinusoid approximation and filtering the frequency of the clock signals therefrom to produce a true swept frequency sinusoid.

12. An apparatus receiving a Linear Frequency Modulated, LFM, signal and concurrently (i) upconverting in frequency the received LFM signal (ii) expanding the modulation bandwidth of the upconverted LFM signal to produce a wideband LFM carrier signal, the apparatus comprising:

a Voltage Controlled Oscillator, VCO, controllable to produce a frequency modulated carrier wave output signal in accordance with a received modulation control signal;

a reference signal source for producing a fixed frequency reference signal in the band of the carrier signal;

a mixer for mixing a portion of the frequency modulated carrier wave output signal received from the VCO with the reference signal received from the reference signal source to produce a difference frequency signal;

a frequency divider circuit for receiving the difference signal from the mixer and reducing it in frequency to a frequency range of the received baseband LFM signal; and a phase detector for producing the modulation control signal responsive to a detected phase difference between a reduced frequency difference signal received from the frequency divider circuit and the received baseband LFM signal;

wherein the VCO, reference signal source, mixer, frequency divider, and phase detector operate as a phase locked loop.

13. The apparatus according to claim 12 further comprising:

a low pass filter between the frequency divider circuit and the phase detector for substantially filtering harmonics above and including the third from the reduced frequency difference signal produced by the frequency divider circuit.

14. The apparatus according to claim 12 further comprising:

a loop filter within the phase locked loop between the phase detector and the VCO.

15. The apparatus according to claim 12 wherein the phase detector is an analog circuit, and wherein the received LFM signal is sinusoidal.

16. The apparatus according to claim 12 wherein the frequency divider circuit and phase detector are digital circuits, and wherein the received LFM signal is a square wave.

17. A phase locked loop for a transmitter circuit CHARACTERIZED IN THAT the phase locked loop is variably offset in frequency for modulating a transmitted carrier signal to be Linearly Frequency Modulated (LFM) in response to a modulation control signal; and the modulation control signal is developed within the phase locked loop from (i) a fixed frequency reference signal in the band of the carrier signal, and from (ii) a received LFM signal that is both of lessor frequency and lessor modulation bandwidth than the control-LFM signal, to effect (1) a frequency upconversion and (2) a bandwidth expansion of the received LFM signal.

18. The phase locked loop according to claim 17 FURTHER CHARACTERIZED IN THAT:

a portion of the LFM carrier signal is mixed with the fixed frequency reference signal to form a difference signal;

the difference signal is frequency divided; and the frequency divided difference signal is phase detected relative to the received LFM baseband signal in order to generate the modulation control signal.

* * * * *